United States Patent [19]

Yamada et al.

[11] Patent Number: 4,952,522
[45] Date of Patent: Aug. 28, 1990

[54] METHOD OF FABRICATING COMPLEMENTARY SEMICONDUCTOR INTEGRATED CIRCUITS DEVICES HAVING AN INCREASED IMMUNITY TO LATCH-UP

[75] Inventors: Akira Yamada; Tsunenori Umeki; Masatoshi Aikawa, all of Hyogo, Japan

[73] Assignee: Mitsubishi Denki Kabushiki Kaisha, Tokyo, Japan

[21] Appl. No.: 213,102

[22] Filed: Jun. 28, 1988

[30] Foreign Application Priority Data

Jun. 30, 1987 [JP] Japan ................................ 62-164322
Jun. 30, 1987 [JP] Japan ................................ 62-164323

[51] Int. Cl.$^5$ ......................................... H01L 21/265
[52] U.S. Cl. ....................................... 437/34; 437/57; 437/924; 430/5; 364/491
[58] Field of Search .................... 437/34, 57, 924, 948, 437/933; 148/DIG. 9, DIG. 104; 430/5

[56] References Cited

U.S. PATENT DOCUMENTS 3,598,604 8/1971 DePuy ................................ 437/924

FOREIGN PATENT DOCUMENTS 54-025177 2/1979 Japan ..................................... 437/34

OTHER PUBLICATIONS

"Principles of CMOS VLSI Design, A Systems Perspective", (Neil H. E. Weste, Kamran Eshraghian), 1985, p. 89.

Primary Examiner—Brian E. Hearn
Assistant Examiner—Laura M. Holtzman
Attorney, Agent, or Firm—Lowe. Price, LeBlanc, Becker & Shur

[57] ABSTRACT

A novel method for making complementary semiconductor IC devices is described. The method includes the steps of: preparing a N-type semiconductor substrate; preparing a first mask for forming a P-well in the N-type substrate; forming the P-well in the N-type substrate using the first mask; preparing a second mask for forming a first P-type diffusion regions in the substrate and in the P-well; preparing a third mask for forming N-type diffusion regions in the substrate and in the P-well; preparing a fourth mask for forming a second P-type diffusion regions in the unoccupied areas of the N-type substrate and the P-well by carrying out reversing, AND and OR processing of the first, second and third masks, and forming the P-type diffusion regions in the prescribed areas of the substrate and the P-well by placing the fourth mask on the substrate.

13 Claims, 13 Drawing Sheets

FIG. 2 PRIOR ART
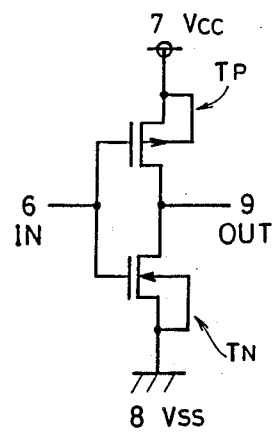
FIG. 4A PRIOR ART
(a) 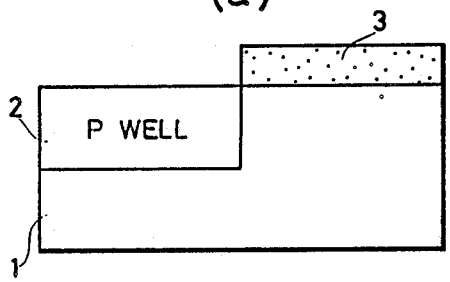
(b) 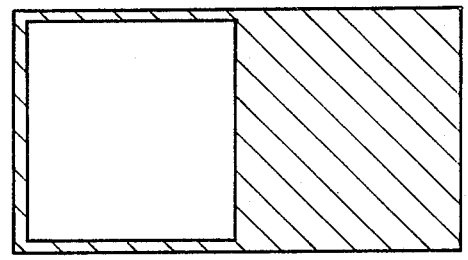
P WELL MASK (M1)
FIG. 4B PRIOR ART
(a) 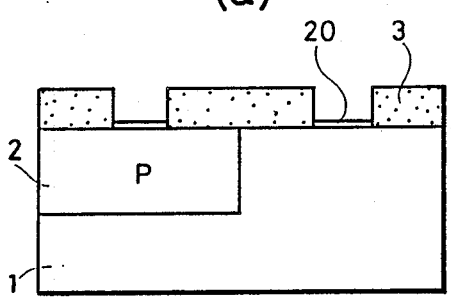
(b) 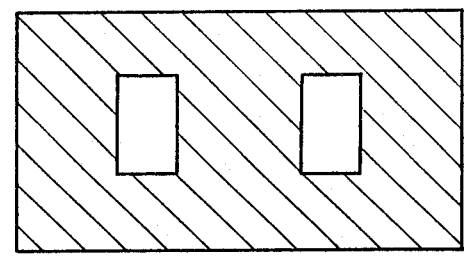
THIN OXIDE MASK (M2)

FIG. 4C  PRIOR ART
(a)  (b)
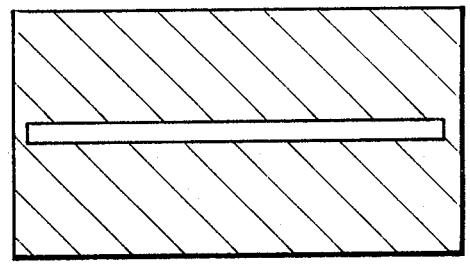
POLISILICON MASK (M3)
FIG. 4D  PRIOR ART
(a)  (b)
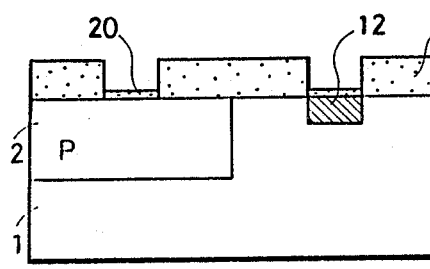 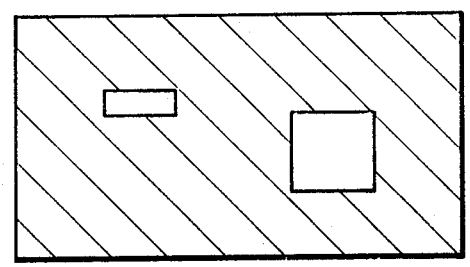
P⁺ MASK (M4)
FIG. 4E  PRIOR ART
(a)  (b)
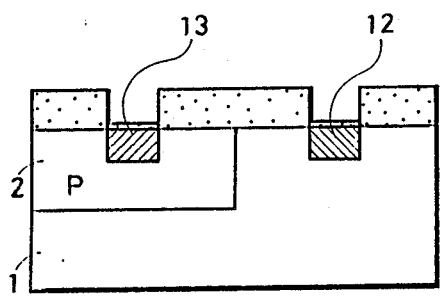 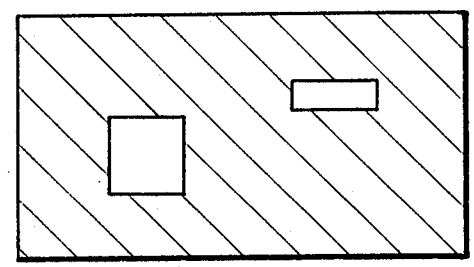
N⁺ MASK (M5)

FIG. 8A
(a)
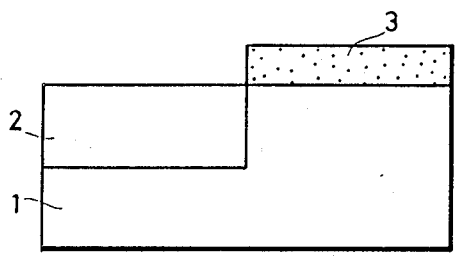
(b)
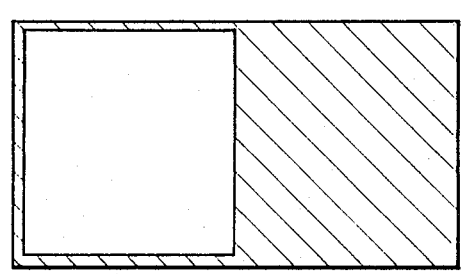
P WELL MASK (M6)
FIG. 8B
(a)
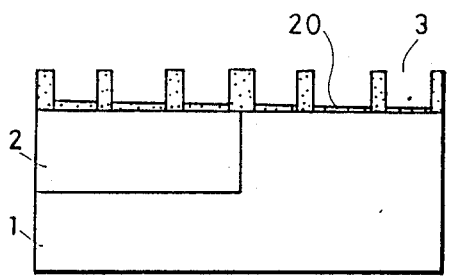
(b)
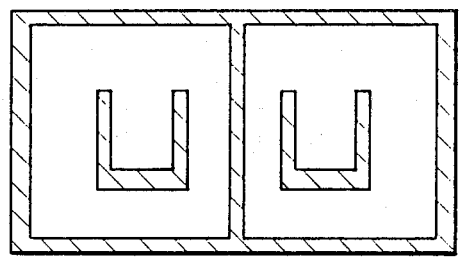
THIN OXIDE MASK

POLISILICON MASK (M8)

P⁺ MASK (M9)

N⁺ MASK (M10)

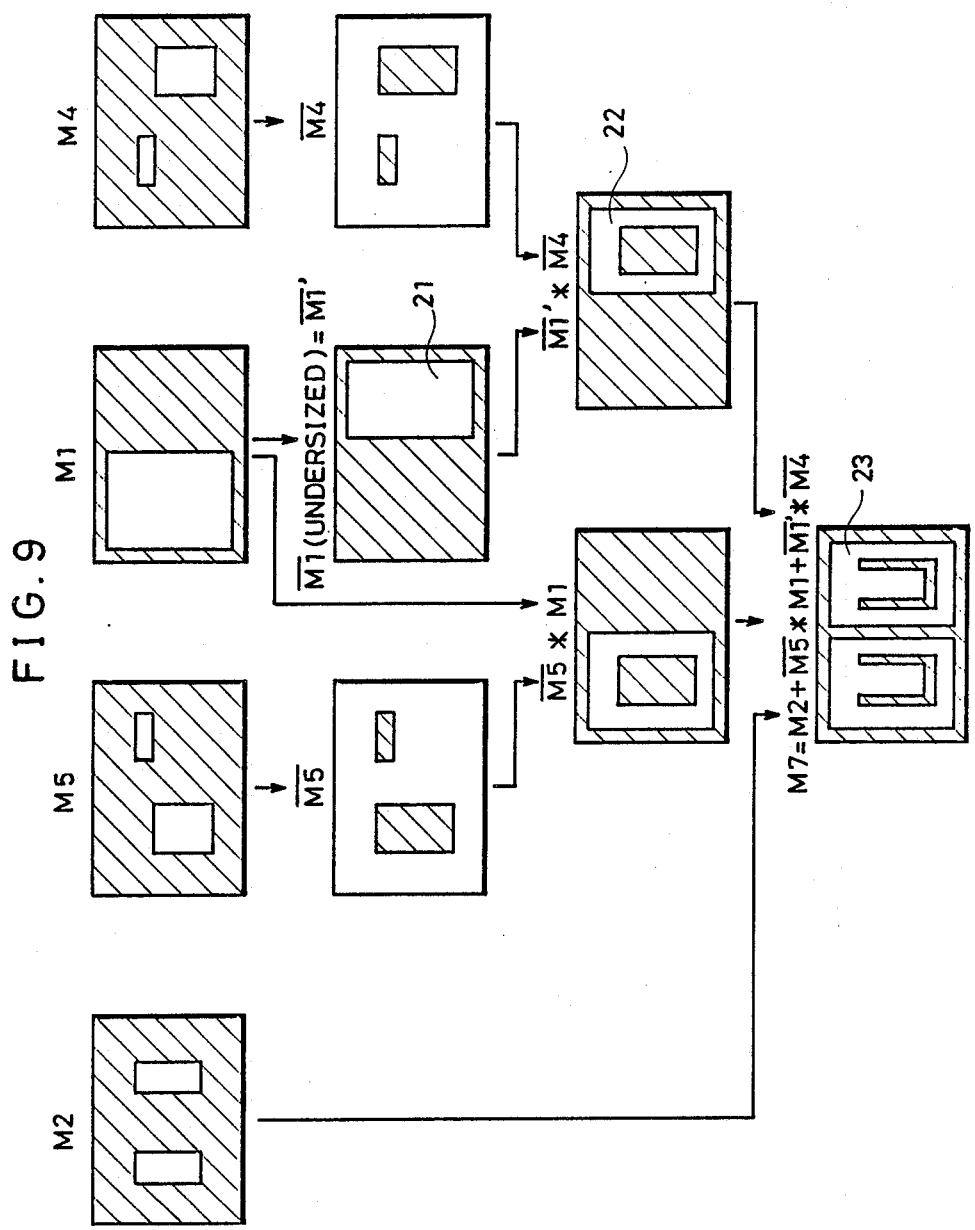

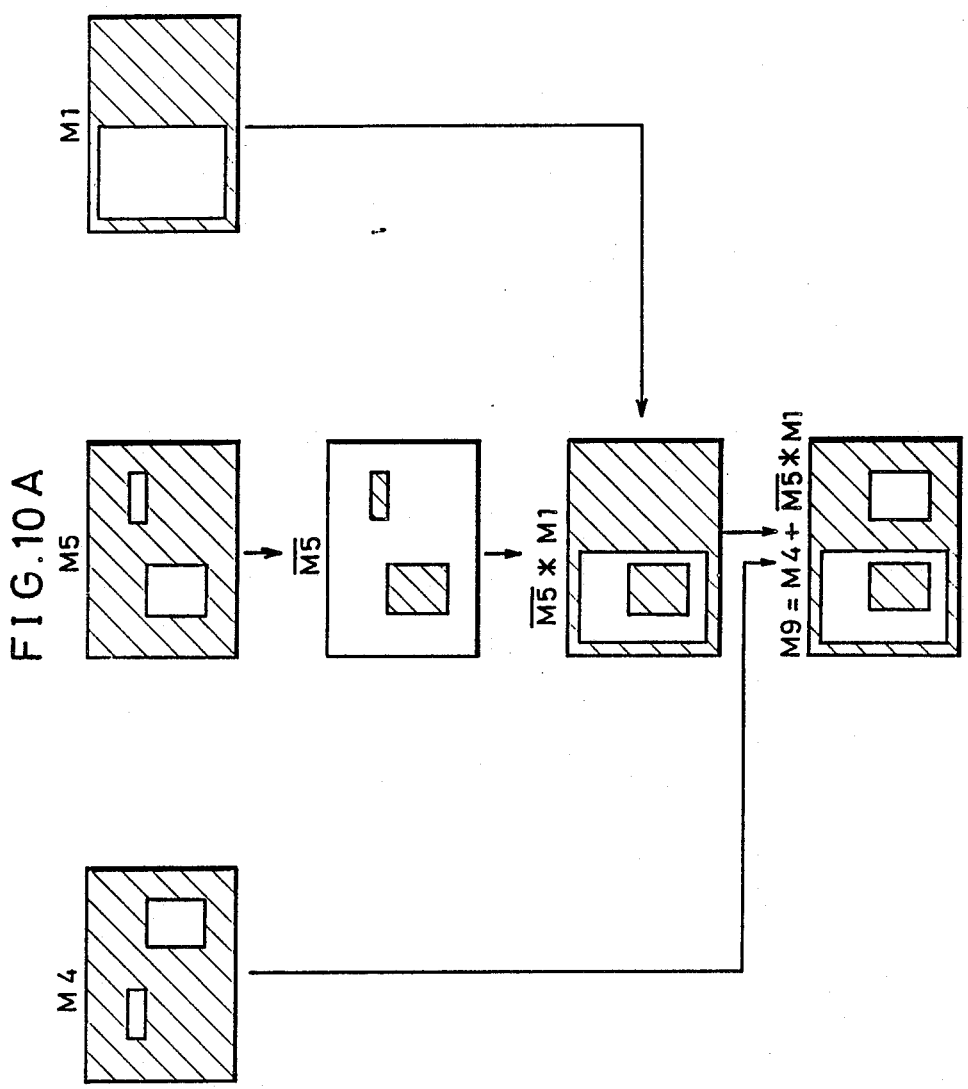

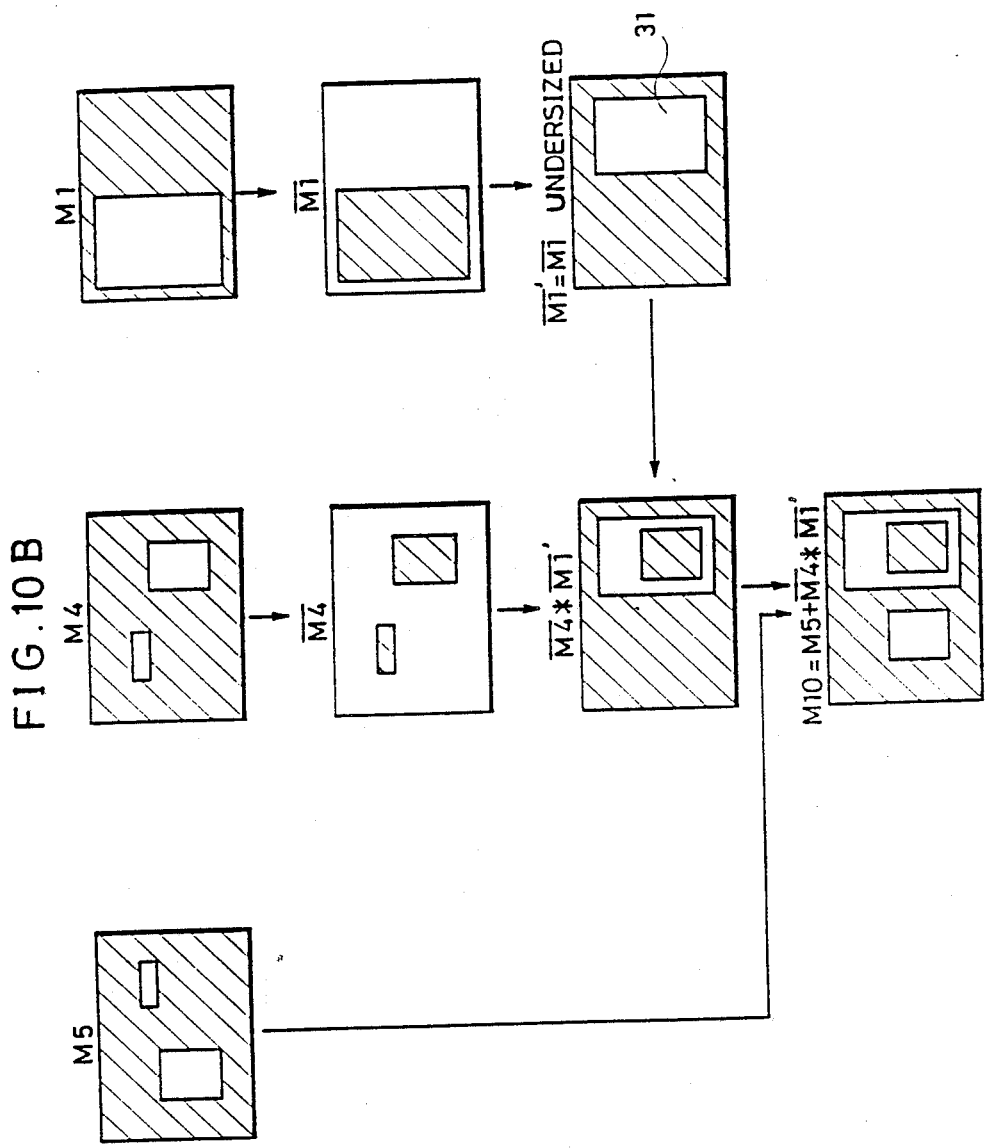

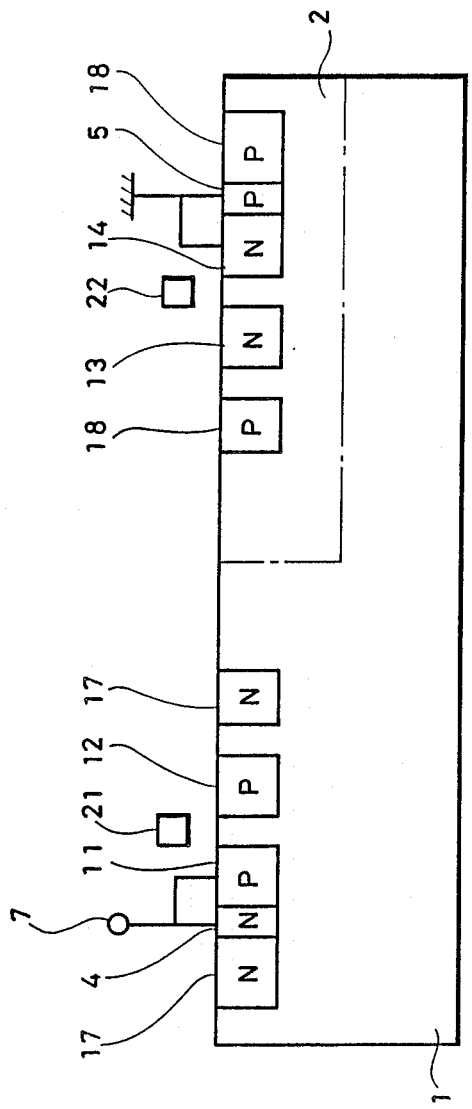

METHOD OF FABRICATING COMPLEMENTARY SEMICONDUCTOR INTEGRATED CIRCUITS DEVICES HAVING AN INCREASED IMMUNITY TO LATCH-UP

BACKGROUND OF THE INVENTION

1. Field of the Invention

This invention generally relates to a method for fabricating complementary semiconductor integrated circuits devices and, in particular, this invention relates to the method for fabricating complementary semiconductor integrated circuits devices which are immune to latch-up.

2. Description of the Prior Art

A typical prior art complementary semiconductor integrated circuit (or IC) device is a complementary metal oxide silicon (or CMOS) inverter, schematic plan view of which is shown in FIG. 1A. FIG. 1B is a schematic cross-sectional view of the same prior art CMOS inverter taken along line IB—IB.

As shown, the CMOS inverter comprises P-channel MOS transistor $T_P$ formed on N-type semiconductor substrate 1, and N-channel MOS transistor $T_N$ formed in the N-type semiconductor substrate. P-channel MOS transistor $T_P$ includes P-type source region 11, P-type drain region 12 and a gate electrode (not shown). When a sufficient negative voltage is applied to the gate electrode, there is formed a P-channel region 15 between source and drain regions 11 and 12. In a similar manner, N-channel MOS transistor $T_N$ includes N-type source region 13, N-type drain region 14 and a gate electrode (not shown). When a sufficient positive voltage is applied to gate electrode 22, there is formed a N-channel region 16 between source and drain regions 13 and 14.

P-type source region 11 of P-channel MOS transistor $T_P$ is provided adjacent to N-type diffusion region 4 in the N-type substrate. Through the N-type diffusion region 4, a supply voltage is applied to the substrate 1. To apply the supply voltage, an aluminum conductor 7 is connected to both P-type source region 11 and N-type diffusion region 4.

Likewise, N-type drain region 14 of N-channel MOS transistor $T_N$ is provided adjacent P-type diffusion region 5 through which a supply voltage is applied to P-well 2. Another aluminum conductor or wire 8 is also connected to N-type drain region 14 and P-type diffusion region 5 in order to connect them to ground.

Aluminum conductor 9 couples drain region 12 of P-channel transistor $T_P$ and source region 13 of N-channel transistor $T_N$, and forms an output conductor, while aluminum conductor 6 couples the gate electrodes of P- and N-channel transistors $T_P$, $T_N$ together and constitutes an input conductor.

FIG. 2 shows an equivalent circuit of the CMOS inverter illustrated in FIG. 1A and 1B. The inverter circuit includes P-channel transistor. $T_P$ and N-channel transistor $T_N$ which are series connected with each other between a power supply $V_{CC}$ and a ground GND.

The operation of the inverter is now described referring to FIG. 2. Input signals to the inverter are simultaneously fed to the gate of both transistors $T_N$ and $T_P$. When a high level voltage is applied to input conductor 6, transistor $T_N$ is turned on, while transistor $T_P$ is turned off, with the result that the inverter provides a low level voltage as an output signal at output conductor 9. Conversely, application of a low level voltage to the input conductor 6 turns on the transistor $T_P$ and turns off the transistor $T_N$, and the inverter produces a high level output voltage on output conductor 9.

In producing diffusion regions in manufacturing semiconductor devices, the selective removal of the $SiO_2$ is required to form openings through which impurities may be diffused. The photoetching method used for this removal is illustrated in FIGS. 3A to 3C. During the photolithographic process the semiconductor substrate is coated with a uniform film of a photosensitive emulsion. A large black-and-white layout of the desired pattern of openings is made and then reduced photographically. This negative, or stencil, of the required dimensions is placed as a mask over the photoresist, as shown in FIG. 3A. By exposure of the emulsion to ultraviolet (UV) light through the mask, the photoresist becomes polymerized under the transparent regions of the stencil. The mask is now removed, and the semiconductor substrate is "developed" by using a chemical (such as trichloroethylene) which dissolves the unexposed unpolymerized) portions of the photoresist film and leaves the surface pattern as shown in FIG. 3B. The emulsion which was not removed in development is now fixed, or cured, so that it becomes resistant to the corrosive etches used next. The chip is immersed in an etching solution of hydrofluoric acid, which removes the oxide from the areas through which dopants are to be diffused. Those portions of the $SiO_2$ which are protected by the photoresist are unaffected by the acid (FIG. 3C). After diffusion of impurities, the resist mask is removed (stripped) with a chemical solvent (such as hot $H_2SO_4$) coupled with a mechanical abrasion process. A negative photoresist is used in the process described above. Positive photoresists are also employed in which the exposed portion of the polymer is washed away and thus retains the unexposed material. The remainder of the processing steps are identical and independent of the type of photoresist used.

FIG. 4A through 4E schematically show process steps for manufacturing the conventional CMOS inverter as illustrated in FIG. 1A and 1B by using above described photolithography. In the drawings, various masks which are used in the manufacturing process steps are shown on the right with a reference character b), and cross-sectional portions of the CMOS inverter which corresponds to that shown in FIG. 1B are illustrated on the left with a reference character (a).

First, P-well mask M1 for forming a P-well 2 in the surface of substrate 1 is put in place on the substrate (FIG. 4A). A thin dioxide mask M2 is then placed on the substrate to form a thin oxide layer 20 (FIG. 4B). As a next step, a mask M3 for forming a polysilicon layer 6 on the substrate is overlaid (FIG. 4C). Resulting polysilicon layer 6 forms the input conductor but it is not shown in FIG. 3C since the formed input conductor does not appear in the cross section along line IB—IB of FIG. 1A. P+ mask M4 is put on the substrate to define P+ diffusion layer 12 in the surface of the substrate 1 (FIG. 4D). In a final step, N+ mask M5 is placed on the substrate to define N+ diffusion layer 13 in the surface of P-well 2 (FIG. 4E).

One problem of the prior art CMOS inverter is that unwanted "parasitic" PNP and NPN transistors are formed in the device. This problem is now described referring to FIG. 5 which shows a cross-section taken along V—V of FIG. 1, and also to FIG. 6 which shows an equivalent circuit of the parasitic transistors of FIG. 5. As shown, P-type source 11, N-type substrate 1 and P-well 2 form a parasitic PNP transistor 23, while N-type substrate 1, P-well 2 and N-type drain 14 form another parasitic NPN transistor 24. Note that a base of NPN transistor 23 and a collector of NPN transistor 24 both comprise the substrate 1. Thus the circuit diagram of FIG. 6 shows an electrical interconnection between a base of PNP transistor 23 and the collector of NPN transistor 24. In a similar way, a collector of PNP transistor 23 and the base of NPN transistor 24 are shown electrically interconnected with each other because they both comprise P-well 23. In the circuit diagram of FIG. 6, the resistance of the substrate 1 and the resistance of P-well are shown as resistors 25 and 26, respectively.

The operation of parasitic transistors 23 and 24 is described. They are normally biased off. However, lateral current flow in the substrate 1 and P-well 2 can establish potential differences across resistors 25 and 26 which turn on parasitic transistors 23 and 24.

In FIG. 5, node 27 is connected to ground, the aluminum conductor 7 is connected to a positive supply voltage Vcc, typically five volts. Because the resistor 25 is connected between the emitter 11 and the base 1 of PNP transistor 23, the base 1 is always at a lower potential than the emitter 11. Thus, when PNP transistor 3 turns on, a positive voltage is applied to the base 2 of NPN transistor 24. With the emitter 14 of NPN transistor 24 being grounded, transistor 24 turns on, thereby drawing current to ground 27 through resistor 25 from the positive supply voltage Vcc applied to the aluminum conductor 7. This increases the voltage, drop across resistor 25, and the voltage across the emitter-base junction of PNP transistor 23. As a result, transistor 23 is turned on harder. This, in turn, applies a higher voltage to the base of NPN transistor, turning on the same transistor harder. In this manner, current is drawn from positive supply voltage Vcc applied to aluminum conductor 7 through parasitic transistors 23 and 24 to ground 27. This action is called "latch-up". and causes a considerable waste of power in CMOS devices. In some instances, the CMOS inverter is destroyed due to excessive heat generated by the power dissipation through the parasitic transistors.

One approach to minimize latch-up in CMOS devices is described by Estreich et. al. in an article entitled "An Analysis of Latch-up Prevention in CMOS ICs using an Epitaxial Layer Process", IDEM '78 paper 9.7, Dec. 4–6, 1978, Wa. D.C. and by Payne et. al. in an article entitled "Elimination of Latch-up in Bulk CMOS", IDEM '80 paper 10.2, Dec. 8–10, 1980, Wa. D.C. Estreich et. al. and Payne et. al. proposed to utilize epitaxial silicon formed on substrate in an attempt to minimize the sheet resistance of the resistor 25 of FIG. 5. Estreich et. al. further utilize a burried layer to minimize the resistance of resistor 26 of FIG. 5. However, the use of epitaxial silicon and burried layers to minimize sheet resistances requires additional processing steps thus increasing the cost of manufacturing CMOS devices. Moreover, the requirement of additional processing steps introduces product defects and tends to reduce manufacturing yield.

For the benefit of understanding, the construction of a prior art CMOS device having an epitaxial layer grown on its substrate is shown in FIGS. 7A and 7B. This CMOS device is manufactured using the "twin tub process" which is disclosed in detail in a book entitled "Principle of CMOS VLSI Design, A Systems Perspective" (Neil H.F, Weste et. al, 1985, page 89). FIG. 7A is a top plan view of the CMOS device, and FIG. 7B is a cross-sectional view taken along line VIIB—VIIB of FIG. 6A.

SUMMARY OF THE INVENTION

Therefore, it is an object of this invention to provide a new and simple method for manufacturing complementary semiconductor IC devices which are immune to latch-up.

It is other object of this invention to provide a new and simple method for manufacturing CMOS inverters immune to latch-up.

Briefly stated, in a new and novel method for manufacturing complementary semiconductor IC devices according to one aspect of this invention, there is prepared a semiconductor substrate which has a major surface and includes impurities of a first conductivity type and of a predetermined impurity concentration. A first mask is also prepared which has a first mask area and used to define on the major surface of the substrate a first impurity region of a second conductivity type having a predetermined impurity density. Then, by placing this first mask over the substrate major surface the first impurity region of the second conductivity type is formed in the predetermined area of the substrate major surface. As a result of this process, the remaining area of the substrate major surface, that is, the surface area other than the area where the first impurity region of the second conductivity type has been formed constitutes a first impurity region of the first conductivity type. A second mask is prepared which has a second mask-area for defining second and third impurity regions of the second conductivity type in the first impurity region of the first conductivity type and the first impurity region of the second conductivity type, respectively. A third mask is prepared which has a third mask area for defining a second impurity regions of the first conductivity type within the first impurity region of the first conductivity type in juxtaposition with the second impurity region of the second conductivity type, and for defining a third impurity region of the first conductivity type within the first impurity region of the second conductivity type in juxtaposition with the third impurity region of the second conductivity type. The complement or negative of the third mask is made and it is combined with the first mask to form a fourth mask. Then the fourth mask is combined with the second mask to form a fifth mask with common unmasked area. In a next step, the fifth mask is applied on the substrate major surface to form a second impurity region of the second conductivity type within the first impurity region of the first conductivity type, and also third and fourth impurity regions of second conductivity type within the first impurity region of the second conductivity type.

In accordance with the method of this invention as briefly described above, the complementary semiconductor IC device is fabricated with second impurity region in the first impurity region of the second impurity region. Therefore, an electrical resistance in the first impurity region of the second conductivity type is reduced. As a result, the latch-up problem can be eliminated.

According to a preferred embodiment of the invention, the complement of the first mask is prepared and its mask area is enlarged. The complement of the second mask is also prepared and it is combined with the complement mask of the first mask to make a sixth mask.

Then the sixth mask is combined with the third mask to form a seventh mask-with common unmasked area. By placing the resulted seventh mask at a predetermined location on the major surface of the substrate, the second and a fourth impurity regions of the first conductivity type are formed within the first impurity region of the first conductivity type in an area where the second impurity region of the second conductivity type has not been formed, and the third region of the first conductivity type is formed within the first impurity region of the second conductivity type in an area where the third and the fourth region of the second conductivity type has not been formed. Following this procedure, the electrical resistance not only in the first impurity regions of the second conductivity type but also in the first impurity region of the first conductivity type is readily reduced, thereby producing a complementary semiconductor IC device which is immune to latch-up.

According to an another preferred embodiment of the invention, the mask preparation including the making of the complementary masks is performed using a computer.

These objects and other objects, features, aspects and advantages of the present invention will become more apparent from the following detailed description of, the present invention when taken in conjunction with the accompanying drawings.

BRIEF DESCRIPTION OF THE DRAWINGS

FIG. 2 is a circuit diagram showing an equivalent circuit of the inverter of FIG. 1A and 1B;

FIGS. 4A through 4E are schematic illustrations showing process steps for manufacturing the prior art CMOS inverter together with masks employed in respective step;

FIGS. 8A through 8E are schematic illustrations showing process steps for manufacturing CMOS inverters according to the present invention together with masks to be employed in the respective step;

FIG. 9 is a schematic illustration showing how the mask of FIG. 8B is prepared;

FIG. 10A is a schematic illustration showing how the mask M9 of FIG. 8D is prepared;

FIG. 10B is a schematic illustration showing how the mask M10 of FIG. 8E is prepared;

FIG. 12 is a cross sectional view taken along line XII—XII of FIG. 11A and corresponds to FIG. 5.

DESCRIPTION OF THE PREFERRED EMBODIMENT

Figure 1A:
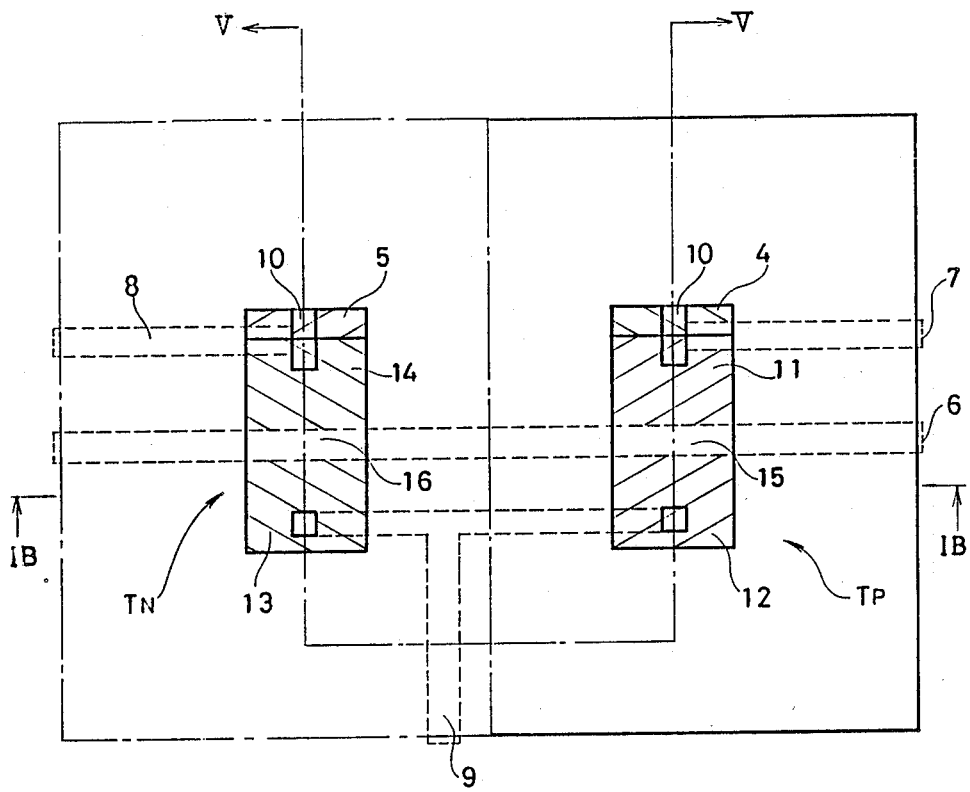
FIG. 1A is a schematic plan view of a prior art CMOS inverter showing its layout.
Figure 1B:
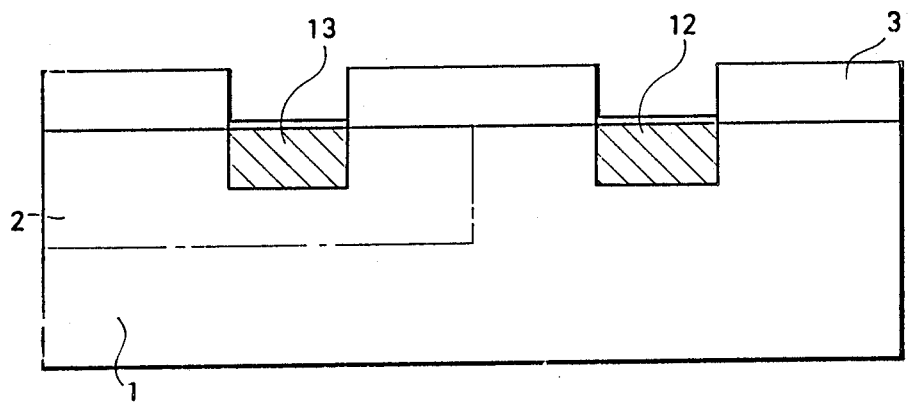
FIG. 1B is a schematic cross-sectional view taken along line IB—IB of the CMOS inverter of FIG. 1A.

FIGS. 8A–8E illustrate, step-by-step, the method of manufacturing complementary semiconductor IC devices, for example, a CMOS inverter according to this invention. In these figures, the mask to be employed in each step is shown on the right side with a reference character (b), while the portion of the CMOS inverter formed by the corresponding mask is shown on the left side with a reference character (a).

Figure 7A:
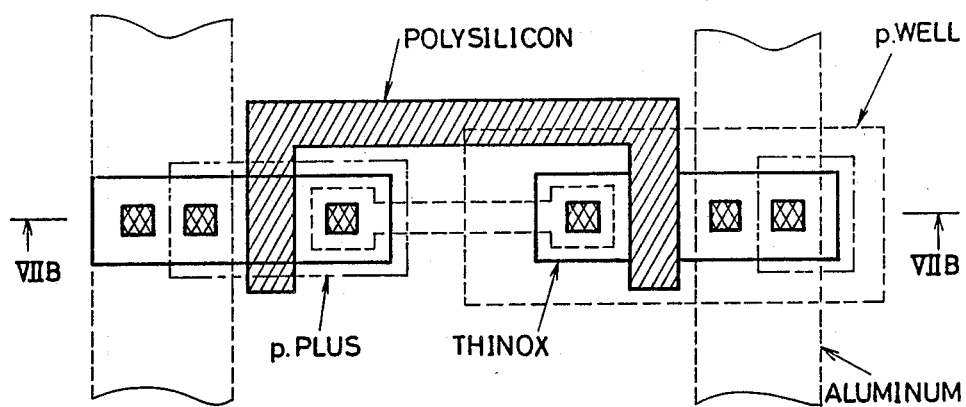
FIG. 7A is a schematic plan view of a prior art CMOS inverter having immunity to latch-up.
Figure 7B:
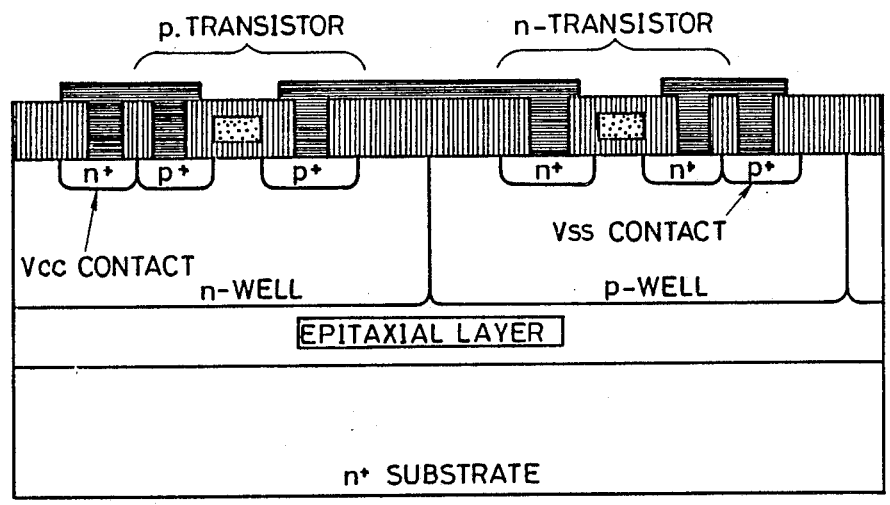
FIG. 7B is a cross-sectional view taken along line VIB—VIB of FIG. 7A.
Figure 8C:
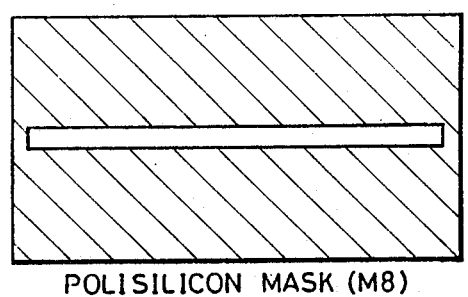
Figure 8D:
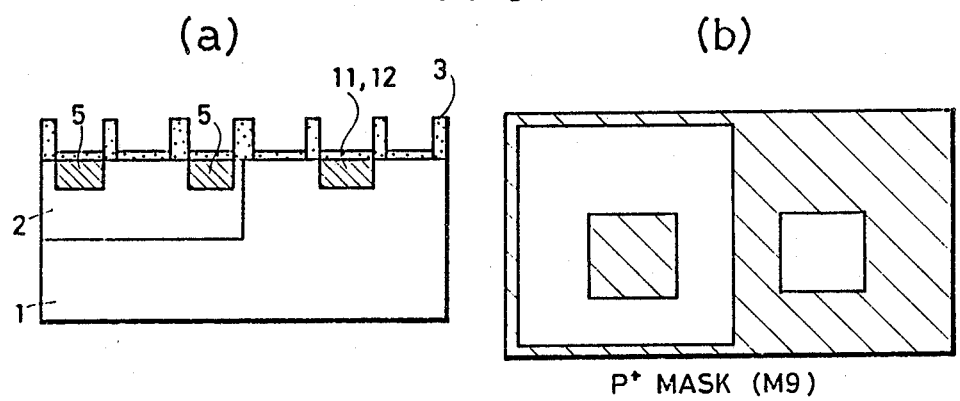
Figure 8E:
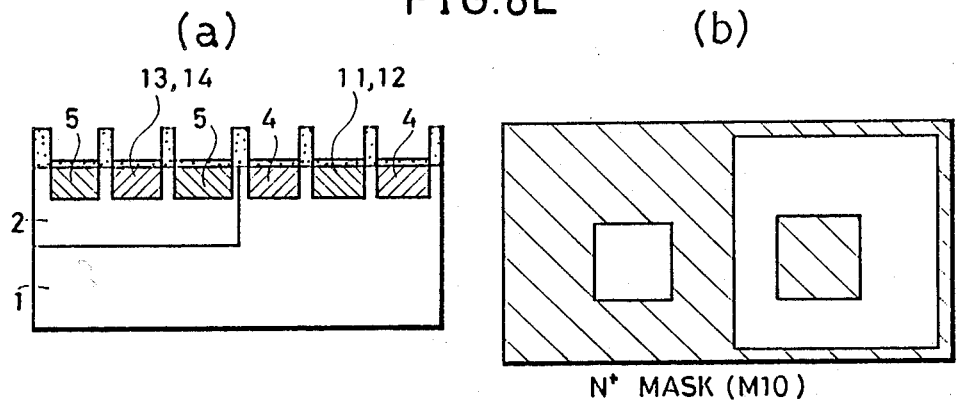

Now the manufacturing process in accordance with this invention is explained in detail having reference to FIGS. 8A–8E. First, as shown in FIG. 8A, a P-well mask M6 for forming P-well 2 in the substrate is applied in place on the major surface of the substrate. Then P-type impurities are doped into the substrate from above, thereby creating P-well in the major surface of the substrate. A mask M7 for forming a thin oxide layer 20 is formed on the substrate 1 (FIG. 8B). In FIG. 8C, a mask M8 for forming a polysilicon layer is put on the substrate 1. The polysilicon layer thus formed is to be used as the input conductor 6 as discussed above in connection with FIG. 1A, but the formed polysilicon layer does not appear in the cross-sectional along line IB—IB, and therefore it is omitted in FIG. 7C. P+ mask M9 shown in FIG. 8D for forming P-type diffusion layers or regions at predetermined locations in the substrate is applied on the substrate surface, followed by doping P-type impurities in the substrate 1 from above the mask M9, thereby creating P-type diffusion layers 5, 11 and 12. P+ diffusion layer 11 and 12 in N-type substrate is to form the source and drain regions of P-channel transistor, while P+ diffusion layer 5 in the P-well functions to lower the resistance of P-well and also acts as a P-type connection for providing electrical connection to the P-well. N+ mask M10 for defining a N-type diffusion layer at a predetermined location in the major surface of the substrate 1 is placed on the substrate, and thereafter N-type impurities are doped into the substrate from above the mask M10 to form N-type diffusion layers 4, 13 and 14 (FIG. 8E). N+ diffusion layer 13 and 14 created in P-well comprises the source and drain regions of N-channel transistor, while N+ diffusion layer 4 created in the N+ substrate functions to lower the resistance of the substrate and also act as a N+ type connection for providing electrical connection to the substrate.

Figure 3C:
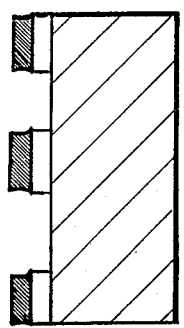
FIG. 3A through FIG. 3C are drawings showing photoetching process used to form a diffusion layers.
Figure 3B:
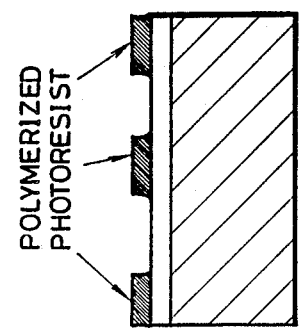
Figure 3A:
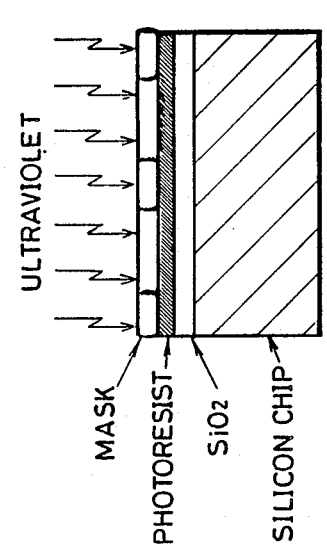

Now preparation for the masks M6–M10 is explained. The P-well mask M6 employed in the process step of this invention is the same as the conventional P-well defining mask M1 shown in FIG. 3D. Thus, the conventional mask M1 is suitably used for defining P-well in the process of this invention.

Referring to FIG. 9, the mask M7 for defining thin oxide layer is formed as follows. First, masks M1, M2, M4 and M5 used in the conventional process for the manufacture of the CMOS inverter are prepared. The complement or negative $\overline{M5}$ of the N+ mask M5 is combined in overlapping relation with the P-well mask M1 to form a mask $\overline{M5} \cdot M1$ which has a transparent or unmasked area defined both by the two complement mask $\overline{M5}$ and the mask M1 as shown. Next, a complement mask $\overline{M1}$ of the P-well mask M1 is prepared and its masking area is enlarged suitably to form an undersized complement mask $\overline{M1'}$ which has an undersized unmasked area 21. The complement mask $\overline{M1'}$ is overlappingly combined with the complement mask $\overline{M4}$ of the P+ mask M4, thereby to form a combined $\overline{M1'} \cdot \overline{M4}$ mask. This mask $\overline{M1'} \cdot \overline{M4}$ also has a transparent or unmasked area 22 defined by both the complement masks $\overline{M1'}$ and $\overline{M4}$. The combined maks $\overline{M5} \cdot \overline{M1}$ and $\overline{M1'} \cdot \overline{M4}$ hus prepared is then overlappingly combined with the conventional thin oxide defining mask M2 to obtain a mask labeled as M7. This mask M7 has a transparent or unmasked area 23 defined in combination by the masks M2, $\overline{M5} \cdot \overline{M1}$ and $\overline{M1'} \cdot \overline{M4}$, and is employed as the thin oxide defining mask in the process of this invention.

The preparation of the mask M7 can be represented by the following process formula:

$$M7 = M2 + \overline{M5} \cdot M1 + \overline{M4} \cdot (\text{undersized } \overline{M1}) \quad \ldots \ldots (1)$$

where "+" indicates "OR" processing step, " · " indicates "AND" processing step, and "$\overline{M5}$" indicates a step to obtain the "complement or negative of mask M5". It is an important feature of this invention that these mask preparation steps can readily be performed by using the computer.

The mask M8 for defining the polysilicon layer is the same as the conventional mask 3 as discussed hereinabove, and therefore no further detailed explanation is given.

Processing steps for preparing P+ mask M9 and N+ mask M10 are represented by the following formulae:

$$M9 = M4 + \overline{M5} \cdot M1 \quad \ldots \ldots (2)$$

$$M10 = M5 + \overline{M4} \cdot (\text{undersized } \overline{M1}) \quad \ldots \ldots (3)$$

where "+", " · " and "$\overline{M1}$" indicate the same processing step as explained with respect to the formula (1).

Processing steps for making P+ mask M9 are illustrated in FIG. 10A. The compliment mask $\overline{M5}$ of N+ mask M5, the mask M1 and mask M4 are prepared. The mask $\overline{M5}$ and the mask M1 are overlappingly combined to form a mask $\overline{M5} \cdot M1$. To this mask combination, another mask M4 is added in overlapping relation to obtain a combined mask M9 consisting of the combined mask $M4 + \overline{M5} \cdot M1$.

Processing steps for making N+ mask M10 are illustrated in FIG. 10B. The complement mask $\overline{M4}$ of P+ mask M4 and the complement mask $\overline{M1}$ of the mask M1 are prepared, then the mask area of the complement mask $\overline{M1}$ is expanded so that the unmasked area 31 is undersized, thereby making an undersized complement mask $\overline{M1'}$. This mask $\overline{M1'}$ and another complement mask $\overline{M4}$ are overlappingly combined to form a mask $\overline{M1'} \cdot \overline{M4}$. To this mask combination, another mask M5 is added in overlapping relation to obtain a combined mask $M5 + \overline{M4} \cdot \overline{M1'}$. The finished mask forms the P+ defining mask M10.

It is easy to perform the processing as represented by the formulae using a computer. When such computerized processing is carried out, there is no need whatsoever to take the trouble of additionally o separately specifying the positions or locations of the diffusion regions or feeding data for them through human intervention. It is also noted that, according to the manufacturing method of this invention, complementary IC devices having the immunity to latch-up are made using the conventional process procedure without necessitating additional steps or measures, for example, the use of specially prepared separate masks and processing technique other than those conventionally employed.

It should be pointed out here the preparation steps for the mask M7, M9 and M10 are shown in FIG. 9 and 10 just for illustrative purposes only, and some modifications can be made to them. For example, undersized or oversized versions of the various masks can suitably be made as needed.

Figure 11A:
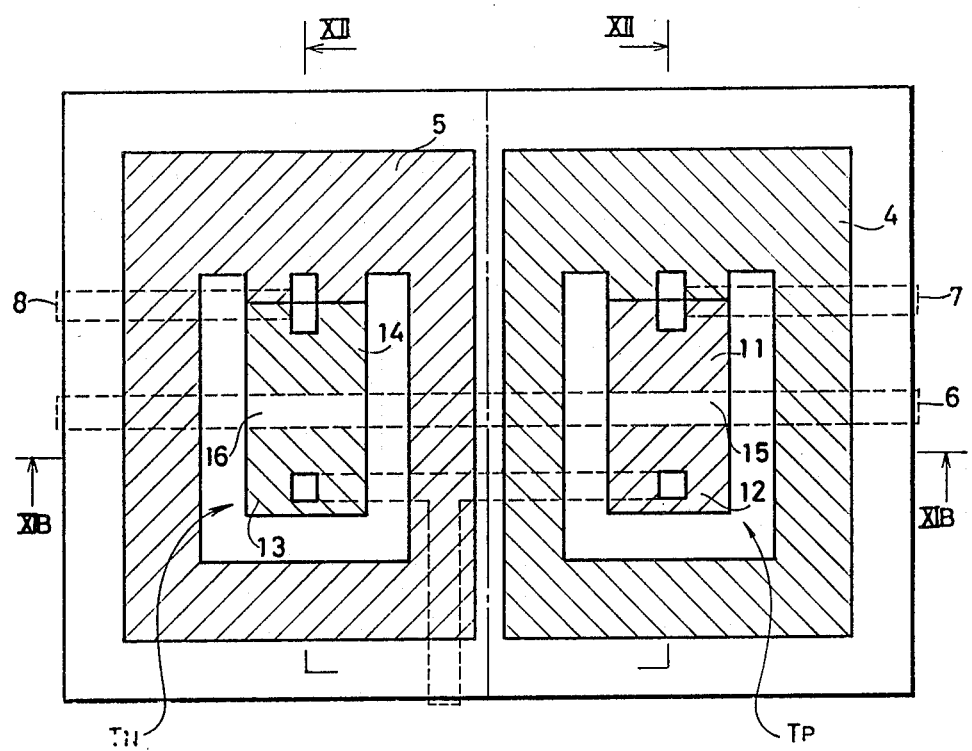
FIG. 11A is a schematic plan view of a CMOS inverter made according to the method of this invention.
Figure 11B:
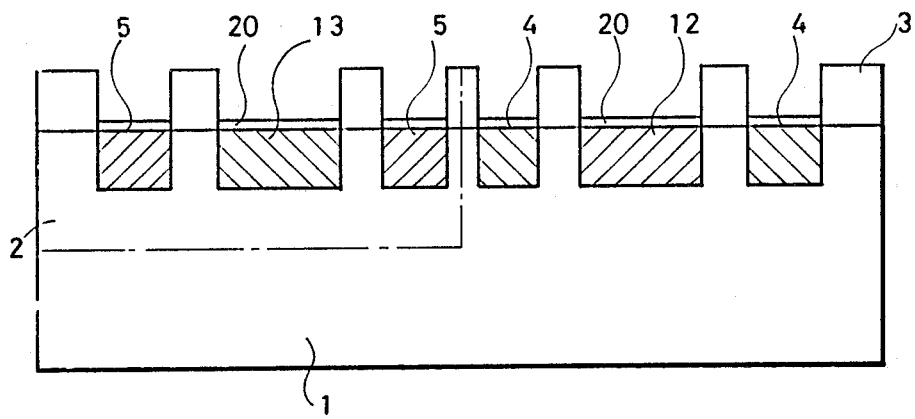
FIG. 11B is a cross sectional view taken along line XIB—XIB of FIG. 11.

FIG. 11A schematically shows a top view of a CMOS inverter made according to the method of this invention. FIG. 11B is a schematic cross sectional view taken along line XIB—XIB of FIG. 11A.

As shown in those figures, the CMOS inverter has a N+ type diffusion layer 4 formed in that area of the major surface of N+ substrate 4 where the P-channel MOS transistor TP is absent, i.e. where the P-channel MOS transistor has not been formed. The CMOS inverter also has P-type diffusion layer 5 formed in that area of the major surface of the substrate 1 where N-channel MOS transistor IN has not been formed. As a result of this unique arrangement, the electrical resistance in the surfaces of N substrate 1 and P-well 2 are greatly reduced, thus rendering the CMOS inverter immune to latch-up.

Figure 5:
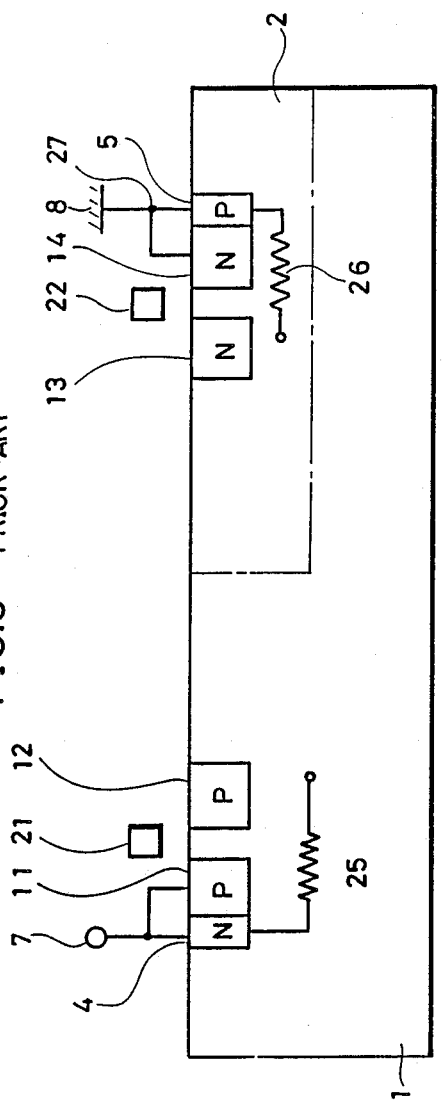
FIG. 5 is a cross sectional view of the prior art CMOS inverter taken along line V—V of FIG. 1 showing schematically the formation of parasitic transistors within the inverter.
Figure 6:
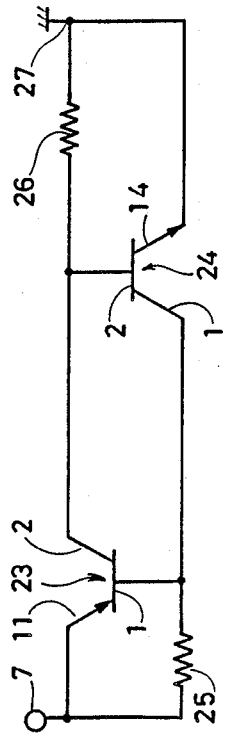
FIG. 6 is a circuit diagram showing an equivalent circuit of the parasitic transistors of FIG. 5.

FIG. 12 schematically shows a cross-section of the CMOS inverter taken along line XI—XI of FIG. 10A and corresponds to FIG. 5 which shows the prior art CMOS inverter. As is apparent from FIG. 12, the CMOS inverter made according to the process of this invention does not contain resistors 25 and 26 which are inherently included in the prior art CMOS inverter of FIG. 5. In other words such internal resistance is not formed in the CMOS inverter made according to this invention, which in turn is effective to eliminate the latch-up problem.

As explained in great detail hereinabove, according to the invention, impurities of the second conductivity type is diffused into the unoccupied area of the P-well, resulting in a greatly reduced electrical resistance at the surface of the first impurity region of the second conductivity type. This is an important feature of the invention which leads to the fabrication of CMOS inverters and CMOS semiconductor IC devices having improved immunity to latch-up. Further, according to this invention, impurities of the first conductivity type may optionally be diffused into the unoccupied area of the first impurity region of the first conductivity type. In this structure, the electrical resistance at the surface of the first conductivity type region is also reduced. This, in turn, contributes to the manufacture of CMOS inverters and CMOS semiconductor IC devices which have much improved immunity to latch-up.

Also in this invention, the unoccupied area where impurities of the same conductivity type is to be diffused can be defined by the operational function of the computer using the conventional diffusion mask. This ensures an easy and simple definition of the impurity region of the same conductivity type either in the P-well or in the substrate, which leads to the simplified method for manufacturing CMOS inverters and CMOS semiconductor IC devices which are highly immune to latch-up.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a complementary semiconductor integrated circuit device comprising the steps of:

preparing a semiconductor substrate which has a major surface and contains impurities of a first conductivity type having a predetermined concentration;

preparing a first mask having a first mask area for defining a first impurity region of a second conductivity type in said major surface of said substrate, said first mask area comprising a masked area and an unmasked area;

forming said first impurity region of the second conductivity type and having a predetermined impurity concentration in the predetermined area of said major surface of said substrate by applying said first mask at a predetermined location on said substrate, the area of said major surface of said substrate other than said first impurity region of the second conductivity type constituting a first impurity region of the first conductivity type;

preparing a second mask having a second mask area for defining a second impurity region of the second conductivity type and a third impurity region of the second conductivity type in first impurity region of the first conductivity type and said first impurity region of the second conductivity type, respectively, said second mask area comprising a masked area and unmasked area;

preparing a third mask having a third mask area for defining a second impurity region of the first conductivity type within said first impurity region of the first conductivity type in juxtaposition with said second impurity region of the second conductivity type, and for defining a third impurity region of the first conductivity type within said first impurity region of the second conductivity type in juxtaposition with said third impurity region of the second conductivity type, said third mask area comprising a masked area and unmasked area;

preparing a complement or negative mask of said third mask wherein the relation between the masked and unmasked areas are reversed with respect to that of said third mask;

preparing a fourth mask having an unmasked area jointly defined by said unmasked areas of said first and second masks, and a masked area defined by said negative mask of said third mask;

forming a second impurity region of the second conductivity type within said first impurity region of the first conductivity type, and third and fourth impurity regions of second conductivity type within said first impurity region of second conductivity type by placing said fourth mask at a predetermined location on said major surface of said substrate, whereby said first impurity region of second conductivity type is made to have a reduced electrical resistance.

2. A method of fabricating a complementary semiconductor integrated circuit device according to claim 1 further including the steps of:

preparing a complement or negative mask of said first mask where the relation between the masked and unmasked areas in the mask area is reversed and the unmasked area is expanded;

preparing a negative mask of said second mask wherein the relation between the masked and unmasked areas in the mask area is reversed;

preparing a fifth mask having a masked area jointly defined by said negative mask of said first mask and said negative masks of said second mask and an unmasked area defined by said third mask;

forming a second impurity region of first conductivity type and a fourth impurity region of a first conductivity type within said first impurity region of first conductivity type in an area where said second impurity region of second conductivity type has not been formed, and a third impurity region of first conductivity type within said first impurity region of second conductivity type in an area where said third, fourth impurity regions of second conductivity type have not been formed, whereby said first region of first conductivity type is made to have a reduced electrical resistance.

3. A method of fabricating a complementary semiconductor integrated circuit device according to claim 2 wherein said masked and unmasked areas in said first, second, third, fourth and fifth masks are defined by a computer.

4. A method of fabricating a complementary semiconductor integrated circuit device according to claim 3 wherein said computer has a pattern reversing function and said negative masks of said first, second and third masks are prepared by said pattern reversing function of said computer.

5. A method of fabricating a complementary semiconductor integrated circuit device according to claim 4 wherein said computer has AND and OR functions, and said masked and unmasked areas of said fourth and fifth masks are defined by said AND, OR functions of said computers.

6. A method of fabricating a complementary semiconductor integrated circuit device according to claim 2 further comprising the steps of:

forming a thin oxide layer over said second, third, and fourth impurity regions of said first conductivity type and over said second, third and fourth impurity regions of second conductivity type.

7. A method of fabricating a complementary semiconductor integrated circuit device according to claim 6, wherein said thin oxide layer is formed by a mask, said step of preparing said mask for forming said thin oxide layer comprising the steps of:

preparing a sixth mask having a mask area defined jointly by said unmasked areas of said first mask and the negative mask of said fifth mask, or defined jointly by unmasked areas of said negative mask of said first mask having undersized unmasked area and the negative mask of said fourth masks, or defined by the unmasked area of said second mask.

8. A method of fabricating a complementary semiconductor integrated circuit device according to claim 7 further including the steps of:

forming an insulating layer on a predetermined area of said major surface of said substrate, and forming a conductor layer on said insulating layer.

9. A method of fabricating a complementary semiconductor integrated circuit device according to claim 8 further comprising the steps of:

forming said second impurity region of first conductivity type;

forming said thin oxide layer on said major surface of said substrate using said sixth mask;

forming said conductor layer on said major surface of said substrate; and forming on said thin oxide layer on said second, third and fourth impurity regions of first conductivity type, and on said second, third and fourth regions of second conductivity type by utilizing said fourth and fifth masks.

10. A method of fabricating a complementary semiconductor integrated circuit device according to claim 8 wherein said complementary semiconductor integrated circuit device comprises a CMOS inverter.

11. A method of fabricating a complementary semiconductor integrated circuit device according to claim 10 wherein said masked and unmasked areas in said first, second, third, fourth, fifth, and sixth masks are defined by a computer.

12. A method of fabricating a complementary semiconductor integrated circuit device according to claim 11 wherein said computer has a pattern reversing function, and said negative masks of said first, second, third and fifth masks are prepared by said pattern reversing function of said computer.

13. A method of fabricating a complementary semiconductor integrated circuit device according to claim 12 wherein said computer has AND and OR functions, and said masked and unmasked area of said fourth, fifth and sixth masks are defined by said AND, OR functions of said computers.

* * * * *